United States Patent
Holzmann

(10) Patent No.: US 9,735,679 B2
(45) Date of Patent: Aug. 15, 2017

(54) METHOD AND APPARATUS FOR A DELAY LOCKED POWER SUPPLY REGULATOR

(71) Applicant: NUVOTON TECHNOLOGY CORPORATION, Hsinchu (TW)

(72) Inventor: Peter J. Holzmann, San Jose, CA (US)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 14/958,827

(22) Filed: Dec. 3, 2015

(65) Prior Publication Data

US 2017/0163152 A1 Jun. 8, 2017

(51) Int. Cl.
G05F 1/40 (2006.01)
H02M 3/158 (2006.01)
H03K 5/133 (2014.01)
G05F 1/46 (2006.01)
H03K 5/00 (2006.01)

(52) U.S. Cl.
CPC ............ *H02M 3/158* (2013.01); *G05F 1/462* (2013.01); *H03K 5/133* (2013.01); *H03K 2005/00019* (2013.01)

(58) Field of Classification Search
CPC .............. H02M 3/157; H02M 3/1584; H02M 3/33515; H03K 17/6871; H03K 17/005; Y02B 70/1475
USPC .......... 323/282–289, 266, 268, 271; 327/161
See application file for complete search history.

(56) References Cited

U.S. PATENT DOCUMENTS

| | | | |
|---|---|---|---|
| 6,490,207 B2* | 12/2002 | Manning | G11C 7/22 365/149 |
| 6,747,495 B1* | 6/2004 | Hart | G06F 1/00 327/156 |
| 6,965,502 B2* | 11/2005 | Duffy | G06F 1/305 361/111 |
| 7,239,116 B2* | 7/2007 | Tang | H02M 3/157 323/266 |
| 7,428,159 B2* | 9/2008 | Leung | H02M 3/33515 323/284 |
| 7,692,910 B2* | 4/2010 | Lavier | G01R 31/40 323/234 |
| 7,865,905 B2* | 1/2011 | Nauerz | G06F 17/30893 719/312 |
| 2008/0317188 A1* | 12/2008 | Staszewski | G04F 10/005 375/376 |
| 2009/0267668 A1* | 10/2009 | Lin | H03K 5/133 327/161 |

* cited by examiner

*Primary Examiner* — Rajnikant Patel
(74) *Attorney, Agent, or Firm* — Kilpatrick Townsend & Stockton LLP

(57) ABSTRACT

A voltage regulator includes a delay chain having a plurality of delay elements, a thermometer to binary encoder coupled to multiple nodes in the delay chain to provide a first binary number that is indicative of an estimated delay of the delay chain, and a latch coupled to the thermometer to binary encoder to receive the binary number. The voltage regulator also includes a signal processing circuit for providing a control signal indicative of a difference between the first binary number with a second binary number that represents a target delay, and a voltage control circuit coupled to the signal processing circuit for providing an output voltage based on the control signal from the processing circuit.

20 Claims, 10 Drawing Sheets

METHOD AND APPARATUS FOR A DELAY LOCKED POWER SUPPLY REGULATOR

BACKGROUND OF THE INVENTION

This invention relates to the field of power supply regulation and control. In particular, some embodiments of this invention are directed to power supply regulation for optimal performance and efficiency trade-off for digital logic supplies.

In digital circuits, the maximum operating clock speed is typically limited by the maximum path delay of the combinational logic, the RC delay time of the routing, the setup and hold times of the flip-flops, and the clock skew of the clock supplied to the flip-flops. However, the gate delays can vary for a given design due to process variations or operating conditions. Therefore, devices fabricated based on a given design can have great variations in their performance. Digital designers spend ample time trying to 'close timing' after a design has been synthesized and routed. They use RC extraction models and Process, Voltage and Temperature (PVT) corners to analyze the timing, such that under the worst case PVT corner, the flip-flops are guaranteed to latch the expected data. It can be seen that a great deal of effort is spent in circuit design to resolve issues caused by variations in device performance. Therefore, an improved way to manage variations in device performance is highly desirable.

BRIEF SUMMARY OF THE INVENTION

Embodiments of the present invention are directed to a method and apparatus that can adjust the supply voltage in order to maintain a fixed delay through a circuit with combinational logic and flip-flops despite variations in device parameters caused by process variation and operating conditions, etc. In some embodiments, the apparatus provides a regulated output voltage that is proportional to a target gate delay of an internal chain of combinational logic and flip-flops that are part of the routed APR (Auto Place and Route) logic. The internal chain of combinational logic and flip-flops are selected so that they are representative of the real circuit. The control loop of the regulator adjusts the supply voltage in order to maintain a fixed delay through a reference circuit with combinational logic and flip-flops that is supplied by the same regulator. In some embodiments, the digital designer no longer needs to consider the worst case supply voltage when doing timing analysis, but instead can use the maximum voltage with worst case temperature and process corner. Many advantages can be provided by embodiments of the invention. For example, gate area and power consumption can be saved as the low voltage corner no longer needs to be considered. Also, for fast corner operation, the circuit automatically reduces the supply voltage, which reduces the power consumption.

According to some embodiments of the present invention, a voltage regulator includes a delay chain having a plurality of delay elements, a thermometer to binary encoder coupled to multiple nodes in the delay chain to provide a first binary number that is indicative of an estimated delay of the delay chain, and a latch coupled to the thermometer to binary encoder to receive the binary number. The voltage regulator also includes a signal processing circuit for providing a control signal indicative of a difference between the first binary number with a second binary number that represents a target delay, and a voltage control circuit coupled to the signal processing circuit for providing an output voltage based on the control signal from the processing circuit.

According to some embodiments of the present invention, a voltage regulator has a series delay chain including a plurality of delay elements providing a plurality of delayed logic signals as a thermometer code, the delay chain receiving an output voltage of the voltage regulator as its supply voltage. The voltage regulator also has a plurality of latches coupled to the corresponding plurality of delay elements for latching the thermometer code. A first timing control clock is coupled to the input of the series delay chain, and a second timing control clock is coupled to the plurality of latches to determine the latching time of the thermometer code. A thermometer to binary encoder is coupled to the plurality of latches to provide a first binary number that is indicative of an estimated delay of the series delay chain. The voltage regulator also has a signal processing circuit for providing a digital control signal indicative of a difference between the first binary number and a second binary number that represents a target delay. A voltage control circuit is coupled to the signal processing circuit for adjusting the output voltage based on the digital control signal from the processing circuit, such that the estimated delay of the delay chain matches the target delay. The second binary number that represents the target delay is determined based on a timing difference between the first timing control clock and the second timing control clock.

In an embodiment of the voltage regulator, the thermometer encoder is configured to receive a thermometer code signal from multiple nodes in the delay chain and provide a digital signal comprising a plurality of bits representing the first binary number.

In an embodiment, the signal processing circuit includes a digital difference circuit for providing an error signal indicative of a difference between the first binary number with the second binary number that represents a target delay, a digital gain circuit coupled to the digital difference circuit for amplifier the error signal, and a digital loop filter circuit coupled to the digital gain circuit for configured to provide loop stability of the voltage regulator and for providing the control signal.

In an embodiment, each of the delay elements includes an inverter. In another embodiment, each of the delay elements can include a buffer circuit.

In an embodiment, the output voltage is coupled to each of the plurality of delay elements.

In an embodiment, the voltage control circuit comprises a PWM (Pulse Mode Modulation) control circuit.

In an embodiment, the voltage control circuit comprises a LDO (low-dropout) circuit.

In an embodiment, the LDO circuit includes a DAC (digital-to-analog) converter, a comparator, and first and second transistors.

In an embodiment, the voltage control circuit includes a digital logic circuit that is configured to generate a control pulse having a pulse width determined by a time delay through a programmable digital buffer chain configured to provide a time delay determined by the digital control signal. The programmable digital buffer chain includes a plurality of stages, each stage having one or more delay elements, and each stage is configured to be bypassed in response to a respective bit in the digital control signal.

According to some embodiments of the present invention, a voltage regulator for controlling a power supply voltage to a circuitry includes a delay tracking circuit for producing a digital binary value indicative of an estimated delay associated with the circuitry and a voltage regulation circuit coupled to the delay tracking circuit. The voltage regulation circuit is configured to compare the digital binary value to a target value and adjusts the supply voltage based on the comparison.

According to some embodiments of the present invention, a voltage regulator for controlling a power supply voltage to a circuitry includes a delay tracking circuit: and a voltage regulation circuit coupled to the delay tracking circuit. The delay tracking circuit includes a series delay chain including a plurality of delay elements providing a plurality of delayed logic signals as a thermometer code, the delay chain receiving an output voltage of the voltage regulator as its supply voltage. The delay tracking circuit also includes a thermometer to binary encoder configured to convert the thermometer code to a first binary number that is indicative of an estimated delay of the series delay chain. The voltage regulation circuit includes a signal processing circuit for providing a digital control signal representing a difference between the first binary number and a second binary number that represents a target delay. The voltage regulation circuit also includes a voltage control circuit coupled to the signal processing circuit for adjusting the output voltage to vary a delay of the series delay chain based on the digital control signal from the processing circuit, such that the delay of the delay chain matches the target delay.

In some embodiments, the above voltage regulator, also includes a plurality of latches coupled to the corresponding plurality of delay elements for latching the thermometer code, a first timing control clock coupled to the input of the series delay chain, and a second timing control clock coupled to the plurality of latches to determine the latching time of the thermometer code. The thermometer to binary encoder is coupled to the plurality of latches to provide the first binary number that is indicative of an estimated delay of the delay chain. The second binary number that represents the target delay is determined based on a timing difference between the first timing control clock and the second timing control clock.

In an embodiment of the above voltage regulator, the delay tracking circuit includes a delay chain having a plurality of delay elements, a thermometer to binary encoder coupled to multiple nodes in the delay chain to provide a first binary number that is indicative of an estimated delay of the delay chain, and a latch coupled to the thermometer to binary encoder to receive the binary number.

In an embodiment, the thermometer encoder is configured to receive a thermometer code signal from the multiple nodes in the delay chain and provide a digital signal comprising a plurality of bits representing the first binary number.

In an embodiment, the output voltage is coupled to each of the plurality of delay elements.

In an embodiment, each of the delay elements comprises an inverter or a buffer circuit.

In an embodiment, the voltage regulation circuit includes a signal processing circuit for providing a control signal indicative of a difference between the first binary number with a second binary number that represents a target delay, and a voltage control circuit coupled to the processing circuit for providing an output voltage based on the control signal from the processing circuit.

In an embodiment, the signal processing circuit includes a digital difference circuit for providing an error signal indicative of a difference between the first binary number with the second binary number that represents a target delay, a digital gain circuit coupled to the digital difference circuit for amplifier the error signal, and a digital loop filter circuit coupled to the digital gain circuit for configured to provide loop stability of the voltage regulator and for providing the control signal.

In an embodiment, each of the delay elements includes an inverter. In another embodiment, each of the delay elements can include a buffer circuit.

In an embodiment, the output voltage is coupled to each of the plurality of delay elements.

In an embodiment, the voltage control circuit comprises a PWM (Pulse Mode Modulation) control circuit.

In an embodiment, the voltage control circuit comprises a LDO (low-dropout) circuit.

In an embodiment, the voltage control circuit includes a digital logic circuit that is configured to generate a control pulse having a pulse width determined by a time delay through a programmable digital buffer chain configured to provide a time delay determined by the digital control signal. The programmable digital buffer chain includes a plurality of stages, each stage having one or more delay elements, and each stage is configured to be bypassed in response to a respective bit in the digital control signal.

A further understanding of the nature and advantages of the present invention may be realized by reference to the remaining portions of the specification and the drawings.

DETAILED DESCRIPTION OF THE INVENTION

The description below will make reference to a series of drawing figures enumerated above. These diagrams are merely an example and should not unduly limit the scope of the claims herein. In connection with the various aspects illustrated and described, one of ordinary skill in the art would recognize other variations, modifications, and alternatives.

In some embodiments, a regulated output voltage is provided that is proportional to a target gate delay of an internal chain of combinational logic and flip-flops that are part of the routed APR (Auto Place and Route) logic. The control loop of the regulator adjusts the supply voltage in order to maintain a fixed delay through a reference circuit with combinational logic and flip-flops that is supplied by the same regulator. In some embodiments, the circuit uses a clock source that is fed through a chain of gates (inverters shown) that are supplied by the output of the power regulator. Depending on the supply voltage, the clock will propagate through the chain over a time governed by the delay of the chain. The internal nodes of the chain are tapped off to a thermometer to binary converter. In some embodiments, most of the circuit is implemented using digital gates and can be emulated on a platform like an FPGA (field programmable gate array).

Figure 1A:
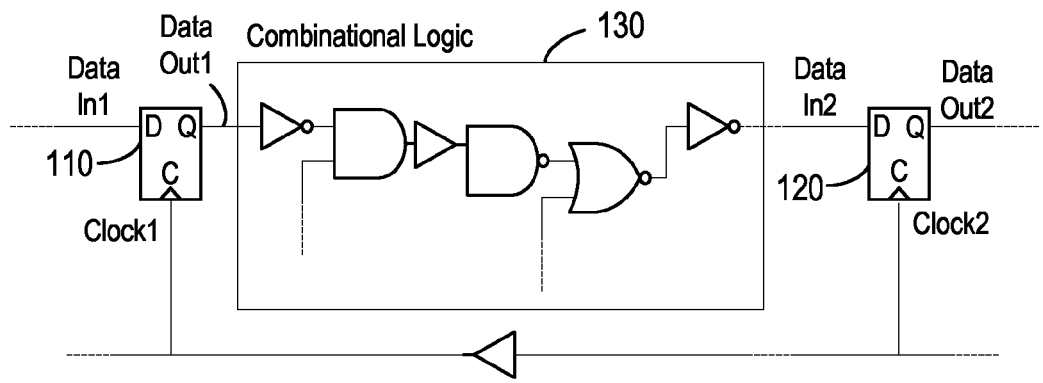
FIG. 1A is a simplified block diagram illustrating an exemplary digital circuitry according to an embodiment of the present invention.

FIG. 1A is a simplified block diagram illustrating an exemplary digital circuitry according to an embodiment of the present invention. As shown in FIG. 1A, the circuitry includes a first flip-flop 110, a second flip-flop 120, and a combinational logic block 130. Input data Data In1 enters flip-flop 110, propagates through combinational logic block 130, and reaches flip-flop 120. In FIG. 1A, the output of flip-flop 110, Data Out1, enters combinational logic block 130, and the output of combinational logic block 130 becomes input to second flip-flop 120, Data In2. The second flip-flop 120 provides an output Data In2. In FIG. 1A, flip-flop 110 is driven by Clock1, and flip-flop 120 is driven by Clock2. The maximum operating clock speed is typically limited by the maximum path delay of the combinational logic, the RC delay time of the routing, the setup and hold times of the flip-flops, and the clock skew of the clock supplied to the flip-flops. Alternatively, given a maximum clock speed, the transistors in the combinational circuit and the flip-flops need to be sized so that the total delay allows operation at the given speed. An example of the timing components are illustrated below.

Figure 1B:
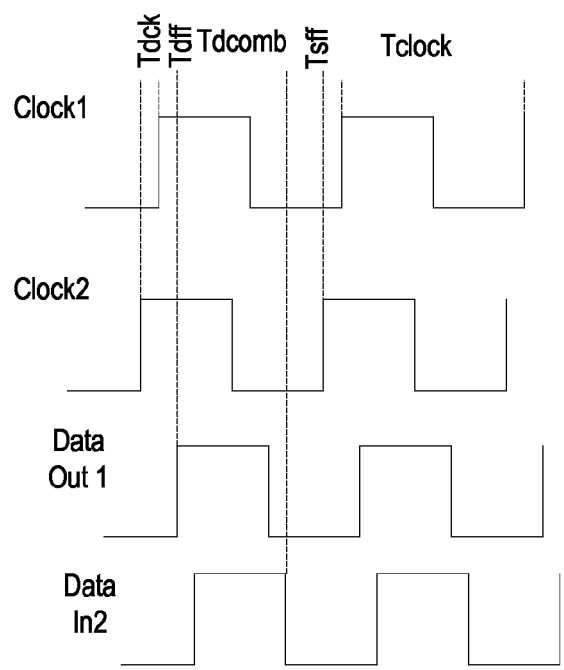
FIG. 1B is a timing diagram illustrating various timing components for the determination of clock speed in the circuitry of FIG. 1A.

FIG. 1B is a timing diagram illustrating various timing components for the determination of clock speed in the circuitry of FIG. 1A. FIG. 1B includes waveforms for Clock1, Clock2, Data Out1, and Data In2. In FIG. 1B, Tdck is the clock edge delay; Tdff is the flip-flop propagation delay, including the hold time; Tdcomp is the combinational logic propagation delay; Tsff is the flip-flop setup time, and Tclock is the period of the clock signal. The timing requirement for this circuitry can be expressed as Tclock>Tdck+Tdff+Tdcomp+Tsff. Therefore, the clock period or frequency is determined by Tdck+Tdff+Tdcomp+Tsff, which is a function of power supply, temperature, and process conditions. Therefore, the clock delay can vary with these conditions.

Figure 1C:
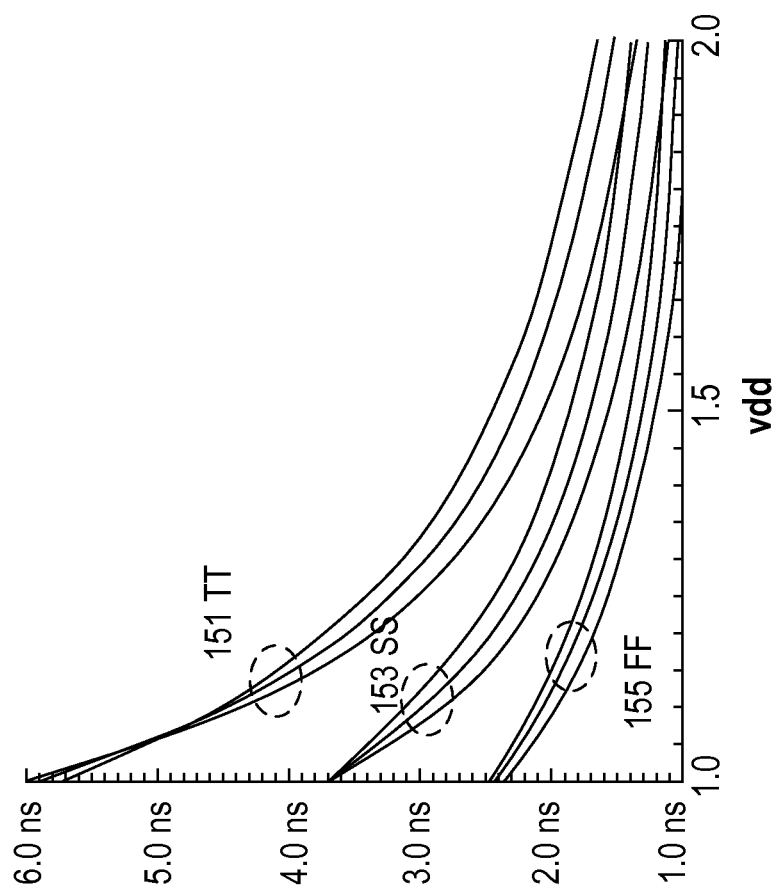
FIG. 1C is a plot illustrating clock delays versus variations in supply voltage Vdd, temperature, and device process conditions according to an embodiment of the present invention.

To illustrate these variations, the inventor has provided a plot of gate delays versus supply voltage for an inverter chain in FIG. 1C. The curves in FIG. 1C are simulated gate delays for a delay chain having 32 inverters, which illustrate variations of gate delay as a function of supply voltage Vdd, temperature, and fluctuations in device parameters due to process variations. Three groups of curves are shown in FIG. 1C. Group 151 includes three curves of gate delay versus supply voltage for three different temperatures for a delay chain having typical transistors. Group 151 is designated as "TT" for typical NMOS transistors and typical PMOS transistors. Group 153 includes three curves of gate delay versus supply voltage for three different temperatures for a delay chain having fast transistors. Group 153 is designated as "FF" for fast NMOS transistors and fast PMOS transistors. Group 155 includes three curves of gate delay versus supply voltage for three different temperatures for a delay chain having slow transistors. Group 155 is designated as "SS" for slow NMOS transistors and slow PMOS transistors. It can be seen that the gate delay of an inverter chain can vary with applied voltage, temperature, and device parameters caused by process variations. In embodiments of the invention, the supply voltage can be varied to compensate for other variables in order to provide a constant gate delay for a circuitry.

Figure 2:
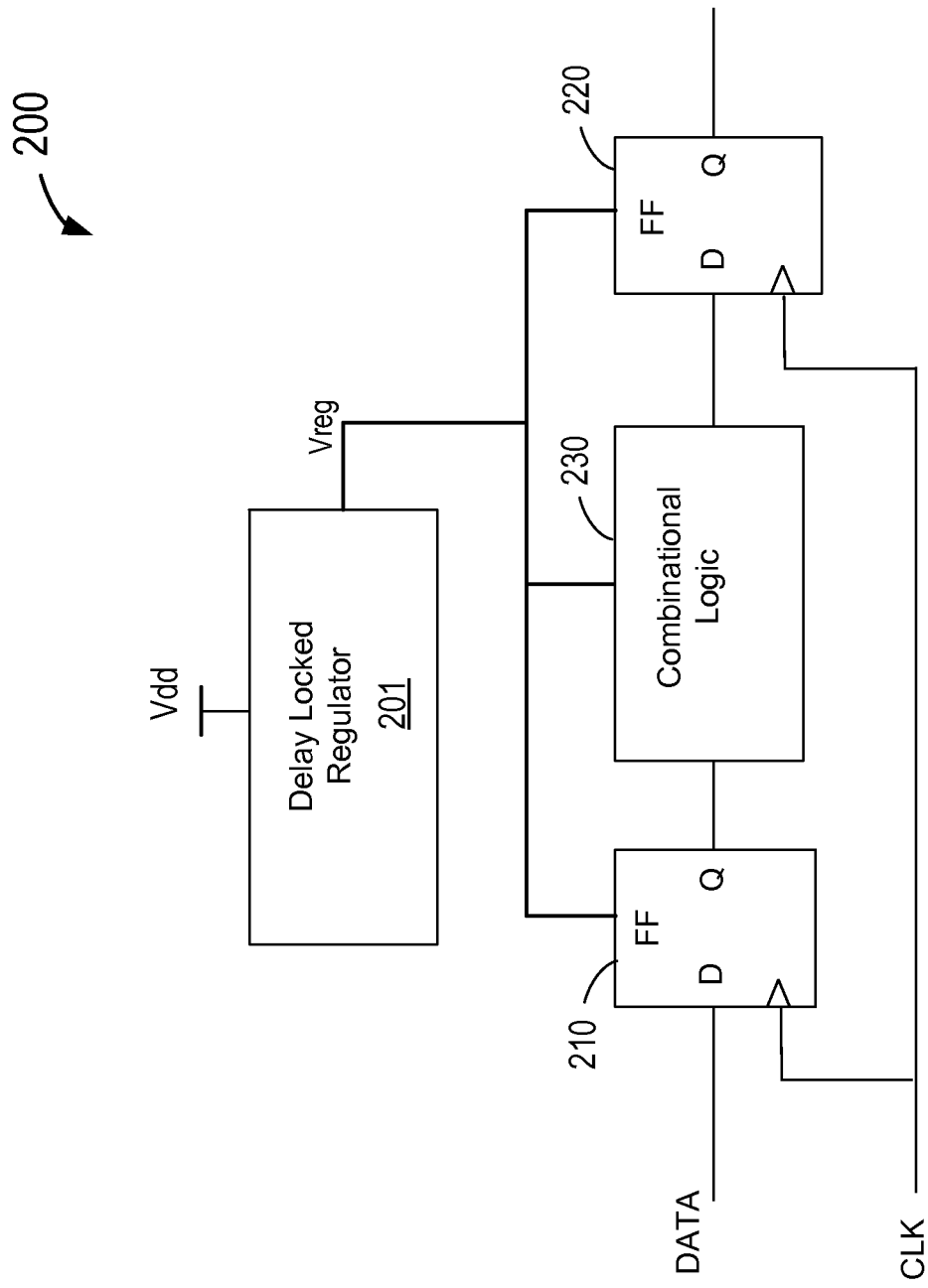
FIG. 2 is a simplified block diagram illustrating a delay locked regulator providing a regulated voltage supply to a digital circuit according to an embodiment of the present invention.

FIG. 2 is a simplified block diagram illustrating a system including a delay locked regulator providing a regulated voltage supply to a digital circuit according to an embodiment of the present invention. As shown in FIG. 2, system 200 includes a voltage regulator 201 which receives power from a system power supply Vdd and is configured to adjust a regulated supply voltage Vreg in order to maintain a fixed delay through a reference circuit with combinational logic and flip-flops that is supplied by the same regulator. In this embodiment, regulator 201 is a delay locked regulator. The regulated supply voltage Vreg is provided to a first flip-flop 210, a second flip-flop 220, and a combinational logic block 230. Input data DATA enters flip-flop 210, propagates through combinational logic block 230, and reaches flip-flop 220. With the regulated supply voltage Vreg, a substantially constant delay can be maintained despite variations in device parameters, temperature, and system supply voltage Vdd, etc.

Figure 3:
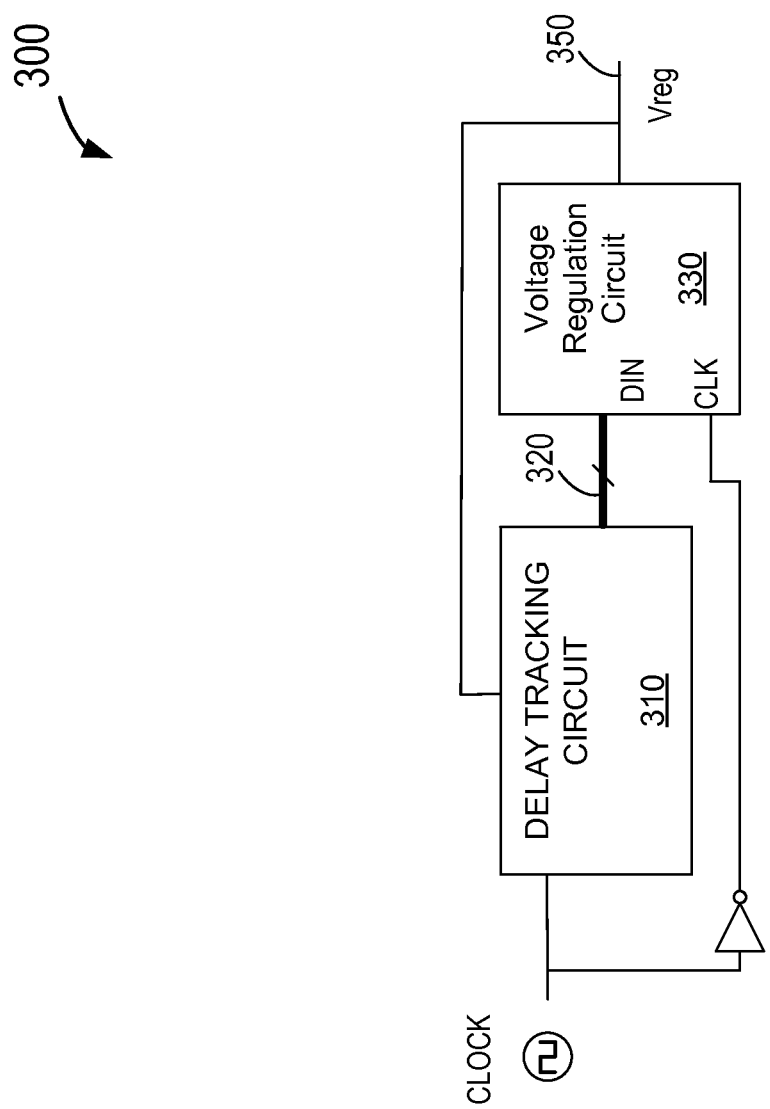
FIG. 3 is a simplified block diagram illustrating a delay locked regulator according to an embodiment of the present invention.

FIG. 3 is a simplified block diagram illustrating a delay locked regulator according to an embodiment of the present invention. As shown in FIG. 3, a voltage regulator 300 for controlling a power supply voltage to a circuitry includes a delay tracking circuit 310 for producing a value 320 indicative of an estimated delay associated with the circuitry. Voltage regulator 300 also has a voltage regulation circuit 330 coupled to the delay tracking circuit 310. Voltage regulation circuit 330 is configured to compare the value to a target value and adjusts a regulated supply voltage Vreg (350) based on the comparison. In some embodiments, the value and target value can be binary values, for example, binary code decimal (BCD) values provided by several bits. FIG. 3 also shows a clock signal CLOCK that feeds to both delay tracking circuit 310 and voltage regulation circuit 330. Voltage regulation circuit 330 has an input DIN for receiving the binary value 320, and a CLK input for receiving the clock signal.

Figure 4A:
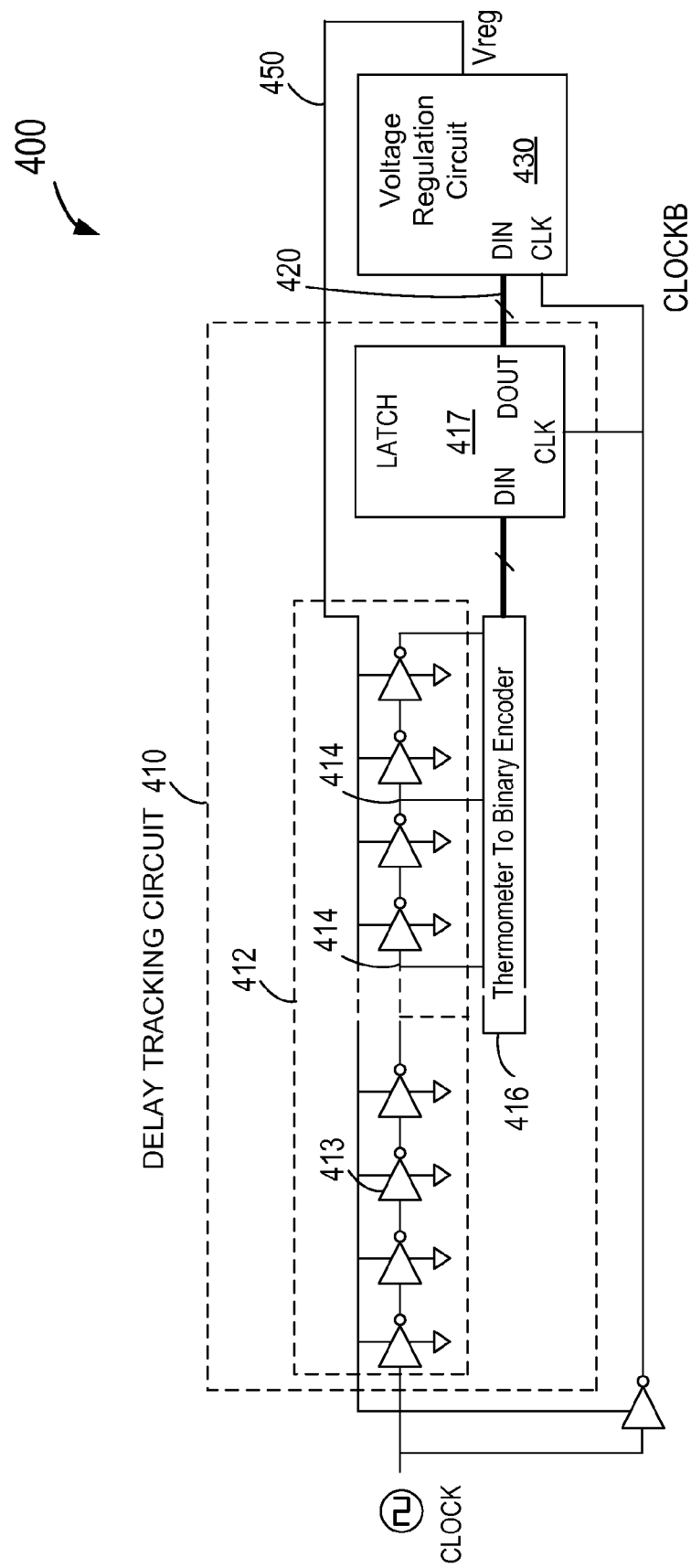
FIG. 4A is a simplified block diagram illustrating a delay locked regulator according to an embodiment of the present invention.

FIG. 4A is a simplified block diagram illustrating a delay locked regulator according to an embodiment of the present invention. As shown in FIG. 4A, a voltage regulator 400 for controlling a power supply voltage to a circuitry includes a delay tracking circuit 410 for producing a binary value 420 indicative of an estimated delay associated with the circuitry. Voltage regulator 400 also has a voltage regulation circuit 430 coupled to the delay tracking circuit 410. Voltage regulation circuit 430 is configured to compare the value to a target value and adjusts a regulated supply voltage Vreg (450) based on the comparison. In FIG. 4A, delay tracking circuit 410 is an example of delay track circuit 310 in FIG. 3. As shown in FIG. 4A, delay tracking circuit 410 has a delay chain 412 and a thermometer to binary encoder 416. Delay chain 412 includes a plurality of delay elements 413. In this embodiment, each of the delay elements 412 includes an inverter. In other embodiments, the delay element can include other circuit elements, such as buffer circuits. In FIG. 4A, thermometer to binary encoder 416 is coupled to multiple nodes 414 in the delay chain to provide a first binary number that is indicative of an estimated delay of the delay chain. Here, the delay chain is configured to provide an estimated delay associated with the target circuitry for which voltage regulator 400 provides the regulated voltage. For example, the number of delay elements is selected to represent an estimated delay associated with the target circuitry. In this embodiment, the regulated output voltage Vreg is provided to each of the plurality of delay elements.

In FIG. 4A, thermometer encoder 416 is configured to tap every other invertor, so the signals have the same phase. If the delay elements are digital buffers, then the thermometer encoder can tap every buffer. In one example, using 32 taps in a delay chain can provide a 32-bit thermometer code, and thermometer to binary encoder 416 encodes the 32-bit thermometer code into a 5-bit binary number.

As shown in FIG. 4A, delay tracking circuit 410 also includes a latch 417. The delay chain with the thermometer to binary converter and latch forms a time to digital converter, where the latched output represents the delay of the circuit. This delay can vary with the process, supply voltage, and temperature (PVT).

Figure 4B:
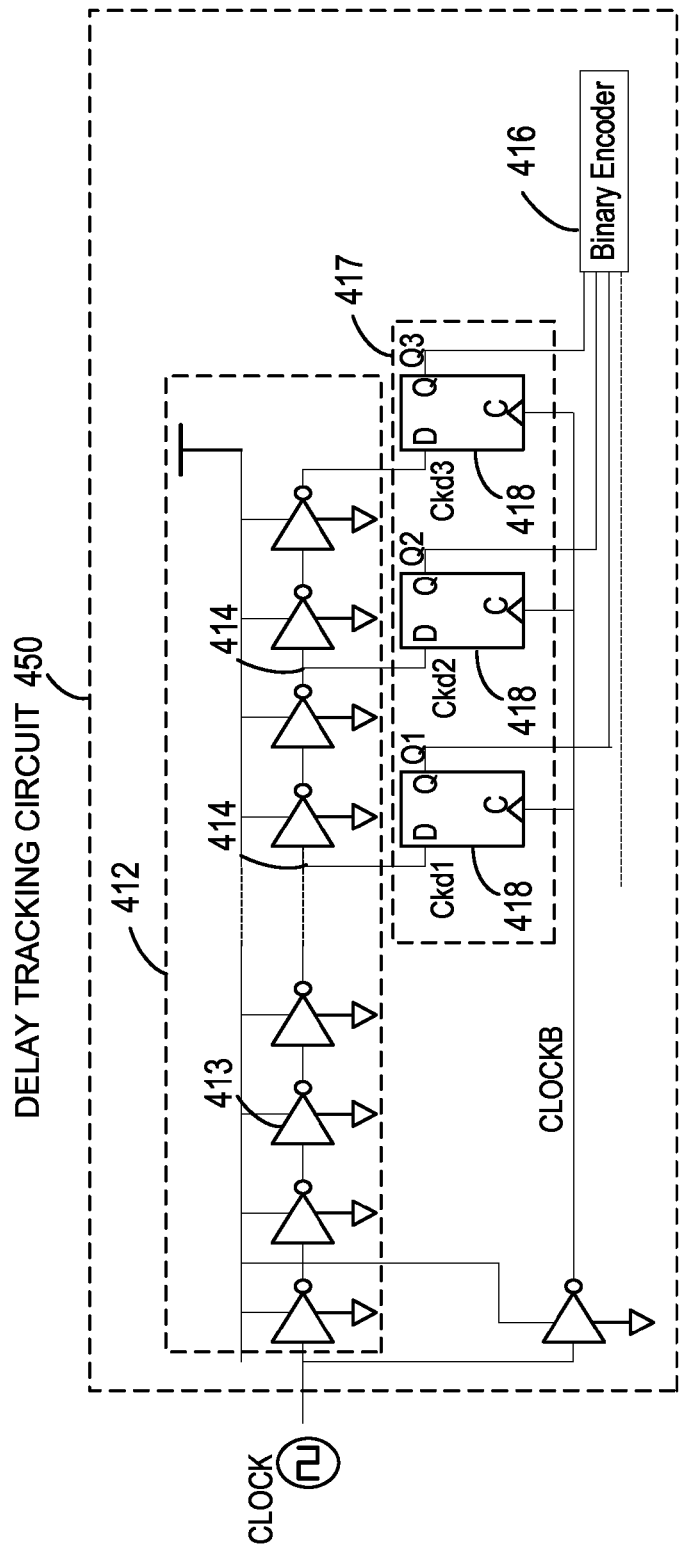
FIG. 4B is a simplified block diagram illustrating an alternative delay tracking circuit for the delay locked regulator according to another embodiment of the present invention.

FIG. 4B is a simplified block diagram illustrating an alternative delay tracking circuit for the delay locked regulator according to another embodiment of the present invention. As shown in FIG. 4B, delay tracking circuit 450 is another example of delay track circuit 310 in FIG. 3. As shown in FIG. 4B, delay tracking circuit 450 has a delay chain 412 and a thermometer to binary encoder 416, similar to corresponding components in delay tracking circuit 410 in FIG. 4A. Delay chain 412 includes a plurality of delay elements 413. In this embodiment, each of the delay elements 412 includes an inverter. In other embodiments, the delay element can include other circuit elements, such as buffer circuits. In FIG. 4B, thermometer to binary encoder 416 is coupled to multiple nodes 414 in the delay chain through latches 418 in latch block 417 to provide a first binary number that is indicative of an estimated delay of the delay chain. Unlike delay tracking circuit 410 in FIG. 4A, latch block 417 are disposed between the delay elements and the binary encoder in delay tracking circuit 450 in FIG. 4B. The inputs to the latches, Ckd1, Ckd2, and Ckd3 are coupled to tap nodes 414 in the delay chain. The outputs of the latches, Q1, Q2, and Q3 are coupled to thermometer to binary encoder 416. In FIG. 4B, thermometer encoder 416 is configured to tap every other invertor, so the signals have the same phase. If the delay elements are digital buffers, then the thermometer encoder can tap every buffer. Using n taps in a delay chain can provide a $2^n$-bit thermometer code, and thermometer to binary encoder 416 encodes the $2^n$-bit thermometer code into an n-bit binary number. For example, using 32 taps in a delay chain can provide a 32-bit thermometer code, and thermometer to binary encoder 416 encodes the 32-bit thermometer code into a 5-bit binary number.

In FIG. 4B, Ckd1, Ckd2, and Ckd3 represent inputs from the right-most three taps in the delay chain, which has n taps. Similarly, in FIG. 4B, the outputs of the latches, Q1, Q2, and Q3 represent the three right-most bits in the thermometer code representing the delay. Further, latches 418 are driven by a clock signal CLOCKB, which in this embodiment, is an inverse of the clock signal CLOCK. CLOCK is also referred to as the first timing control signal, and CLOCKB is also referred to as the second timing control signal. In embodiments of the invention, the second timing control clock signal can be derived from the first timing control clock signal, for example, by using an inverter as described above. In some embodiments, the second timing control clock signal can be derived from the first timing control clock signal using a fixed resistor-capacitor delay or a fixed gate delay. The delay chain is configured to provide an estimated delay associated with the target circuitry for which voltage regulator 400 in FIG. 4A provides the regulated voltage. The type and number of delay elements in the delay chain can therefore be selected accordingly. An advantage of the design in FIG. 4B is that the delays in the binary encoder is not included in the estimated delay. However, more latches may be needed in delay tracking circuit 450 in FIG. 4B. As explained above, an n-bit binary code, $2^n$ latches are needed for the corresponding $2^n$-bit thermometer code.

Figure 4C:
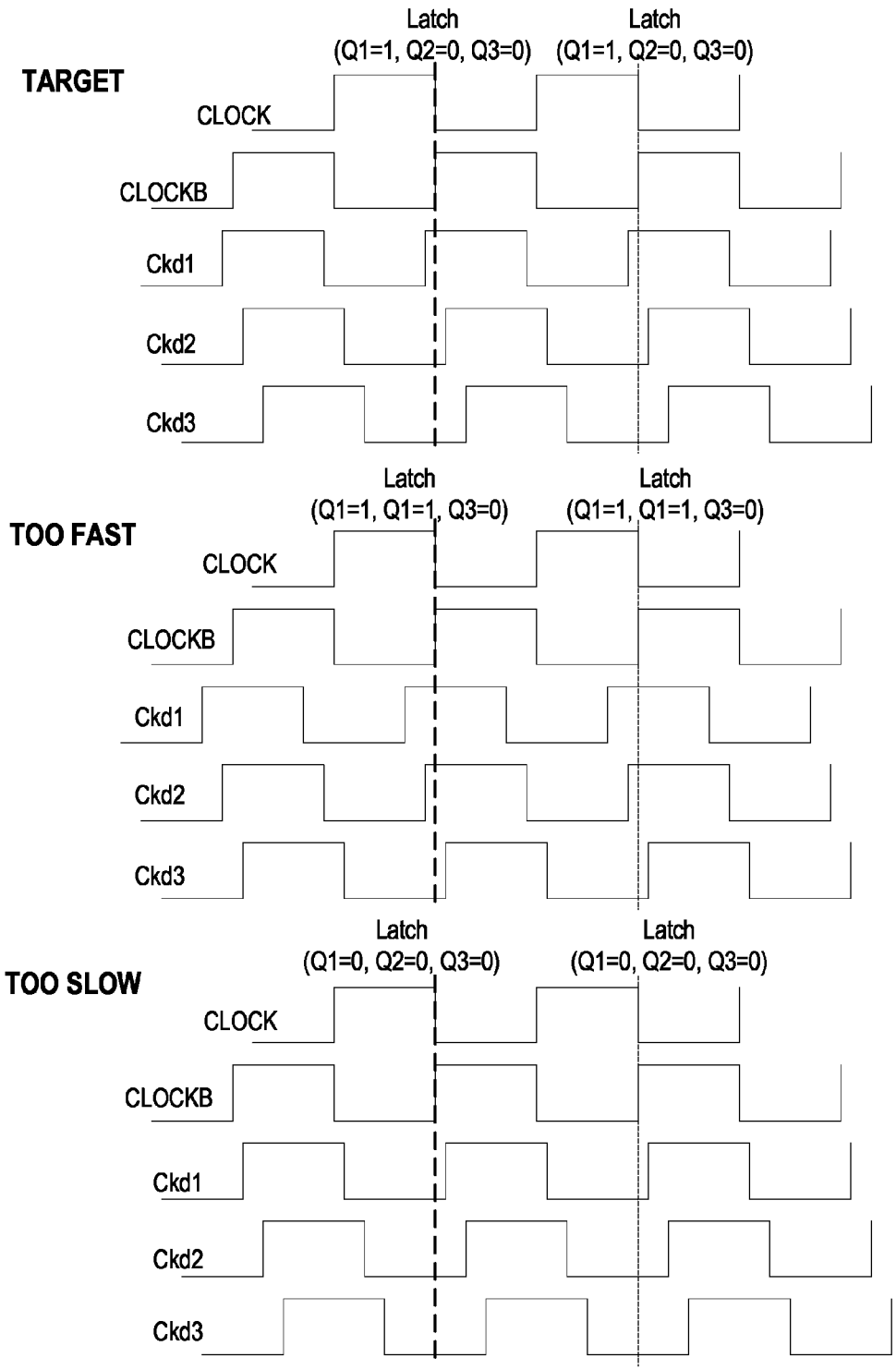
FIG. 4C is a timing diagram illustrating the operation of a delay tracking circuit according to an embodiment of the present invention.

FIG. 4C is a timing diagram illustrating the operation of delay tracking circuit 450 in FIG. 4B according to an embodiment of the present invention. FIG. 4C includes timing diagrams for clock signals CLOCK and CLOCKB, and the inputs of latches 418, Ckd1, Ckd2, and Ckd3 in FIG. 4B. It can be seen that signals Ckd1, Ckd2, and Ckd3 exhibit increasing delays. Broken vertical lines mark the time when the logic values at the tapped nodes of the delay chain are latched into latches 418. As shown in FIG. 4B, the latches are driven by clock signal CLOCKB. Therefore, the data are latches at rising edges of clock signal CLOCKB, or the falling edges of clock signal CLOCK. Three groups of timing diagrams are shown in FIG. 4C. In the "TARGET" group, because of the timing of the latching operation with respect to signals Ckd1, Ckd2, and Ckd3, the outputs of the latches Q1, Q2, Q3 exhibit values of 1, 0, 0, respectively. In the "TOO FAST" group, the delay chain runs faster, resulting in the output of the latches Q1, Q2, Q3 showing values of 1, 1, 0, respectively. If the delay chain runs even faster, the output of the latches Q1, Q2, Q3 could read values of 1, 1, 1, respectively. In the "TOO SLOW" group, the delay chain runs slower, resulting in the output of the latches Q1, Q2, Q3 showing values of 0, 0, 0, respectively. Therefore, the output of the latches provide signals that are similar to a thermometer code that indicates the gate delay in the delay chain. The thermometer to binary decoder is configured to covert the thermometer code signal to a binary signal, which will be compared to a target value by the voltage regulation circuit to regulate the desired output. In FIG. 4C, only three tapped nodes in the delay chain are used to illustrate the operation. However, increasing the number of taps can provide more resolution in the voltage regulation operation. In one example, using 32 taps in a delay chain can provide a 32-bit thermometer code, and thermometer to binary encoder 416 encodes the 32-bit thermometer code into a 5-bit binary number.

Figure 5:
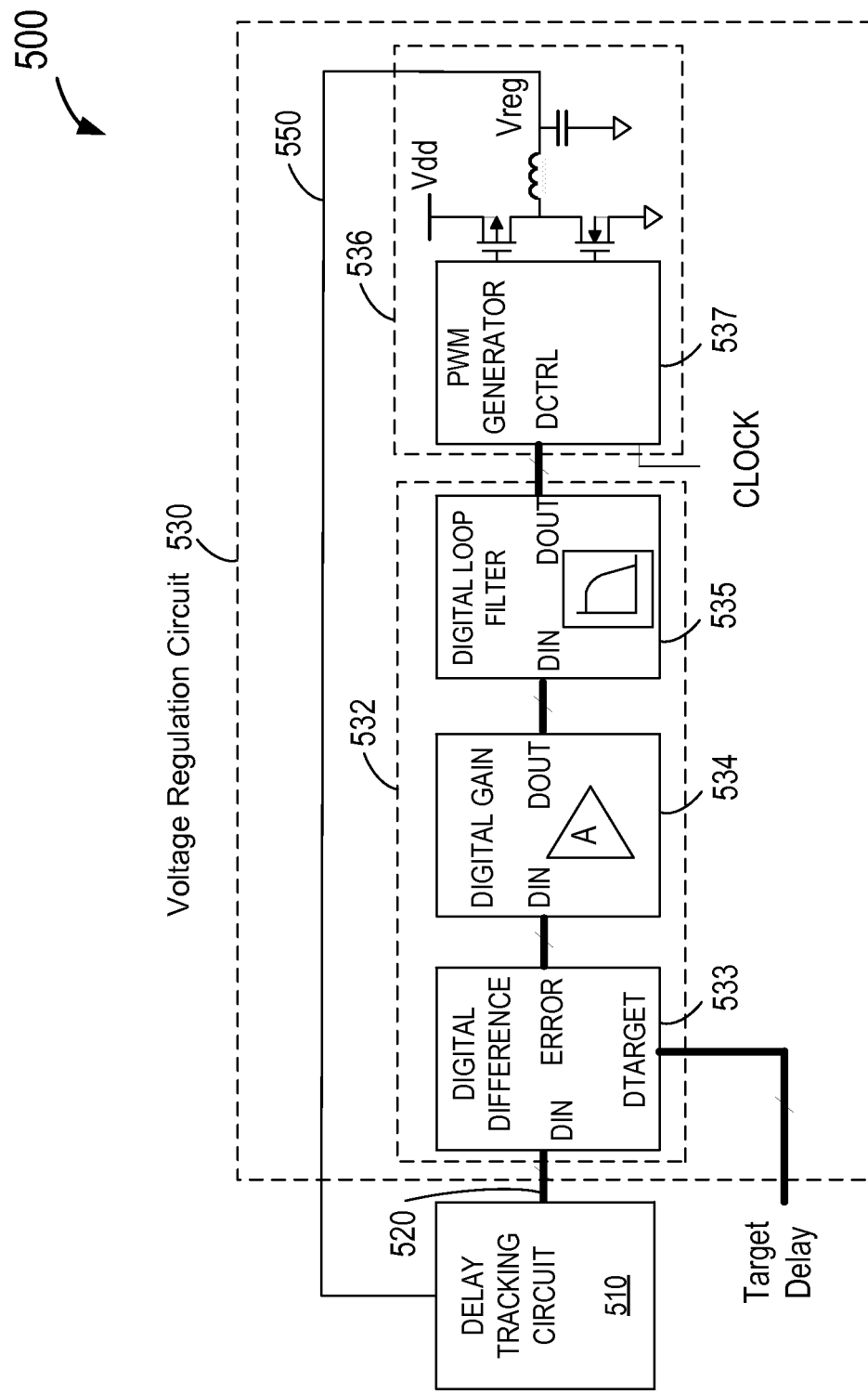
FIG. 5 is a simplified block diagram illustrating a delay locked regulator according to another embodiment of the present invention.

FIG. 5 is a simplified block diagram illustrating a delay locked regulator according to an embodiment of the present invention. As shown in FIG. 5, a voltage regulator 500 for controlling a power supply voltage to a circuitry includes a delay tracking circuit 510 for producing a binary value 520 indicative of an estimated delay associated with the circuitry. Voltage regulator 500 also has a voltage regulation circuit 530 coupled to delay tracking circuit 510. Voltage regulation circuit 530 is configured to compare the value to a target value and adjusts a regulated supply voltage Vreg (550) based on the comparison. In FIG. 5, delay tracking circuit 510 can be similar to delay track circuit 410 in FIG. 4.

As shown in FIG. 5, voltage regulation circuit 530 is coupled to delay tracking circuit 510 to receive the binary number representing a gate delay. Voltage regulation circuit 530 also includes a signal processing circuit 532 for providing a control signal DCTRL indicative of a difference between the first binary number 520 with a second binary number Target Delay that represents a target delay. As shown in FIG. 5, signal processing circuit includes a digital difference circuit 533 for providing an error signal ERROR indicative of a difference between the first binary number with the second binary number that represents the target delay. A digital gain circuit 534 is coupled to the digital difference circuit for amplifier the error signal. A digital loop filter circuit 535 is coupled to the digital gain circuit and is configured to provide loop stability of the voltage regulator and for providing the control signal DCTRL. Voltage regulation circuit 530 also includes a voltage control circuit 536 coupled to signal processing circuit 532 for providing a regulated output voltage Vref based on the control signal DCTRL from the processing circuit.

Digital difference circuit 533 is configured for providing an error signal ERROR indicative of a difference between the first binary number the delay tracking circuit with the second binary number that represents the target delay, shown as Target Delay. The digital difference circuit can be implemented using known digital circuit techniques. In some embodiments, digital difference circuit 533 can be digital comparator or a subtraction circuit. In other embodiments, the subtraction circuit can be implemented as a full adder with one of the inputs inverted.

In FIG. 5, digital gain circuit 534 is configured to receive the error signal from digital difference circuit 533 and amplify the signal with a gain of A. The digital difference circuit can be implemented using known digital circuit techniques. For example, in some embodiments, the digital gain circuit can be a digital shifter, where a shift by one bit results to a multiplication by two.

In FIG. 5, Digital loop filter circuit 535 is configured to be calibrated based on circuit loop stability analysis. After the error signal is amplified in the digital gain circuit and filtered in the digital loop filter circuit, it is provided to voltage control circuit 536 to provide a regulated supply voltage Vreg. In some embodiments, voltage control circuit 536 can be implemented with a known switch mode power supply (SMPS) controlled by a PWM (pulse-width modulated) controller. In the embodiment shown in FIG. 5, voltage control circuit 536 is Buck converter including a digital PWM control signal generator 537, two transistors, an inductor, and an output capacitor. PWM control signal generator 537 is configured to receive control signal DCTRL and produce PWM control pulses to the two transistors in the Buck converter.

In embodiments of the invention, the system linearized gain for the system described in FIG. 5 can be approximated by the following equation:

$$H(s) = \frac{Tdel}{Tdeltarget} = \frac{H_{loop}(s)}{1 + H_{loop}(s)}$$

where $H_{loop}(s)$ is the loop gain. The loop gain can be expressed as follows.

$$H_{loop}(s) = Ag \times Hf(s) \times Apwm \times Htdc(s)$$

where Ag is the gain of the digital gain stage, Hf is the response function of the digital filter, Apwm is the gain of PWM generator, and Htdc is the response function of the time to digital converter or the delay tracking circuit. Htdc(s) can be strongly non-linear, but this circuit could be linearized by using scaled invertor sizes. The system gain can be expressed as follows:

$$H(s) = \frac{Ag \times Hf(s) \times Apwm \times Htdc(s)}{1 + Ag \times Hf(s) \times Apwm \times Htdc(s)}$$

Therefore, $$H(s) = 1$$

if $Ag \times Hf(s) \times Apwm \times Htdc(s) \gg 1$.

It can be seen that System gain H(s) is 1, if $Ag \times Hf(s) \times Apwm \times Htdc(s) \gg 1$, and the delay of the delay chain will be equal to the target delay. Various parameters in the system can be adjusted to meet this condition. For example, Ag, the gain of the digital gain stage, can be increased to adjust H(s), and the digital loop filter can be tuned for stability.

Figure 6:
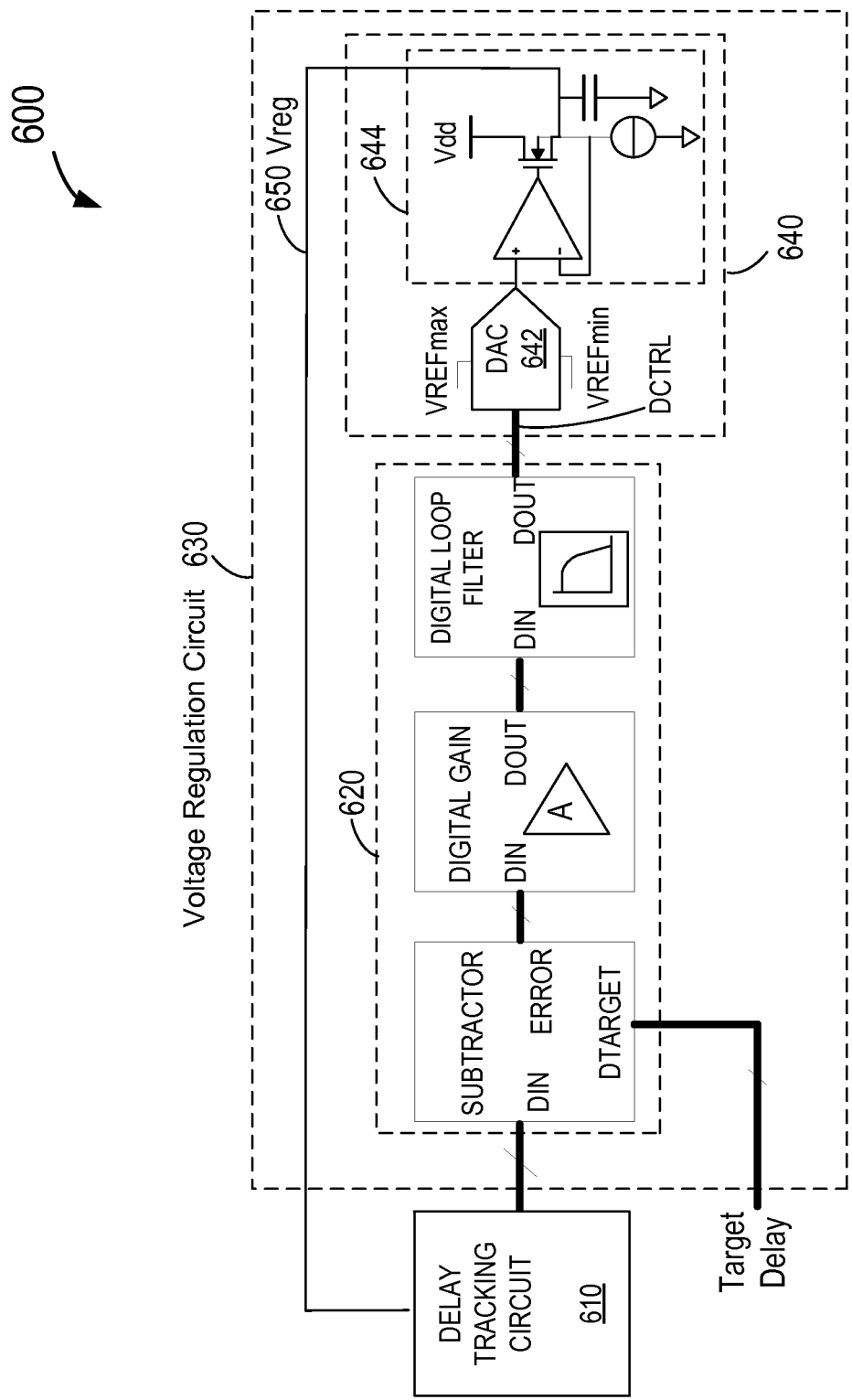
FIG. 6 is a simplified block diagram illustrating a delay locked regulator according to another embodiment of the present invention.

In the delay tracking circuits described above are configured as a delay time to digital number, or time-to-digital, conversion circuit. It can be seen from FIG. 4B that the delay chain 412 is driven by a first timing control clock CLOCK, and the latches 418 are driven by a second timing control clock CLOCKB. As shown in FIGS. 5 and 6, when the loop is settled and stable, the output signal of the latch will be equal to the target delay DTARGET. With reference to FIGS. 4B and 4C, if the time-to-digital conversion output of the binary encoder and latch is defined as a number n, then the equation for the time-to-digital conversion is:

$$Trck1 - Trck2 = N1 * Td + n * Td$$

$$n = \frac{(Trck1 - Trck2) - (N1 * Td)}{Td}$$

where:
Trck1 is the rising edge of the incoming clock (CLOCK);
Trck2 is the rising edge of the latch input clock (CLOCKB);
Td is the unit gate delay of the delay chain (Td can be a function of process, supply voltage, and temperature, etc.);
N1 is a fixed number of gates that are part of the delay chain before the thermometer code is tapped off;

In embodiments of the invention, the delay of the delay chain can be varied by its voltage supply, which is the output voltage of the voltage regulation circuit. The voltage regulation circuit is configured for adjusting the output voltage, such that the delay of the tapped delay chain matches the target delay. For example, if for a given target delay DTARGET=n, when the loop is settled, the target delay tap point (thermometer code) of the delay chain can be represented by the binary number n. At this point, the actual unit gate delay is:

$$Td = \frac{(Trck1 - Trck2)}{N1 + n}$$

This shows that the accuracy of the delay control loop is set by (Trck1−Trck2), N1, and n. N1 and n are implemented as digital binary numbers that have no accuracy limitations. In embodiments of the invention, the timing difference between the rising edges Trck1 and Trck2 sets the accuracy of the output delay. In some embodiments, an accurate relationship between Trck1 and Trck2 is maintained by using the falling edge of a clock with an accurate duty cycle. The clock can just be inverted to provide a rising edge from the falling edge as shown in the embodiments in FIGS. 4A and 4B.

FIG. 6 is a simplified block diagram illustrating a delay locked regulator according to an embodiment of the present invention. As shown in FIG. 6, a voltage regulator 600 for controlling a power supply voltage to a circuitry is similar to voltage regulator 500 in FIG. 5. As shown in FIG. 6, voltage regulator 600 for controlling a power supply voltage to a circuitry includes a delay tracking circuit 610 for producing a binary value indicative of an estimated delay associated with the circuitry. Voltage regulator 600 also has a voltage regulation circuit 630 coupled to the delay tracking circuit 610. Voltage regulation circuit 630 is configured to compare the value to a target value and adjusts a regulated supply voltage Vreg (650) based on the comparison.

Similar to voltage regulation circuit 530 shown in FIG. 5, voltage regulation circuit 630 in FIG. 6 includes a signal processing circuit 620 for providing a control signal DCTRL indicative of a difference between the first binary number with a second binary number that represents a target delay. As shown in FIG. 6, signal processing circuit 620 includes a digital difference circuit for providing an error signal ERROR indicative of a difference between the first binary number with the second binary number that represents the target delay. A digital gain circuit is coupled to the digital difference circuit for amplifier the error signal, and a digital loop filter circuit is coupled to the digital gain circuit for configured to provide loop stability of the voltage regulator and for providing the control signal. Voltage regulation circuit 630 also includes a voltage control circuit 640 coupled to signal processing circuit 620 for providing an output voltage Vref based on the control signal DCTRL from the processing circuit.

A difference between voltage regulation circuit 530 shown in FIG. 5 and voltage regulation circuit 630 in FIG. 6 is that voltage regulation circuit 630 includes a voltage control circuit 640 that includes an LDO (low-dropout) circuit 644 and a digital-to-analog converter (DAC) 642. The control input of the LDO is driven by the DAC. The DAC converts the binary number signal represented by DCTRL to an analog signal. The DAC also contains a minimum and maximum supply reference voltage, which guarantees that the LDO output stays within the maximum supply limit and the minimum limit for operational logic. The intermediate values are determined by the output of the digital loop filter DCTRL, which is the same as the PWM embodiment.

A low-dropout or LDO regulator is a DC linear voltage regulator which can regulate the output voltage. The main components are a power FET and a differential amplifier (error amplifier). One input of the differential amplifier monitors the output, and the second input to the differential amplifier receives the control signal. If the output voltage rises too high relative to the reference voltage, the drive to the power FET changes to maintain a constant output voltage. The advantages of a low dropout voltage regulator over other DC to DC regulators include the absence of switching noise, smaller device size, and greater design simplicity. A disadvantage is that, unlike switching regulators, linear DC regulators must dissipate power across the regulation device in order to regulate the output voltage.

Figure 7:
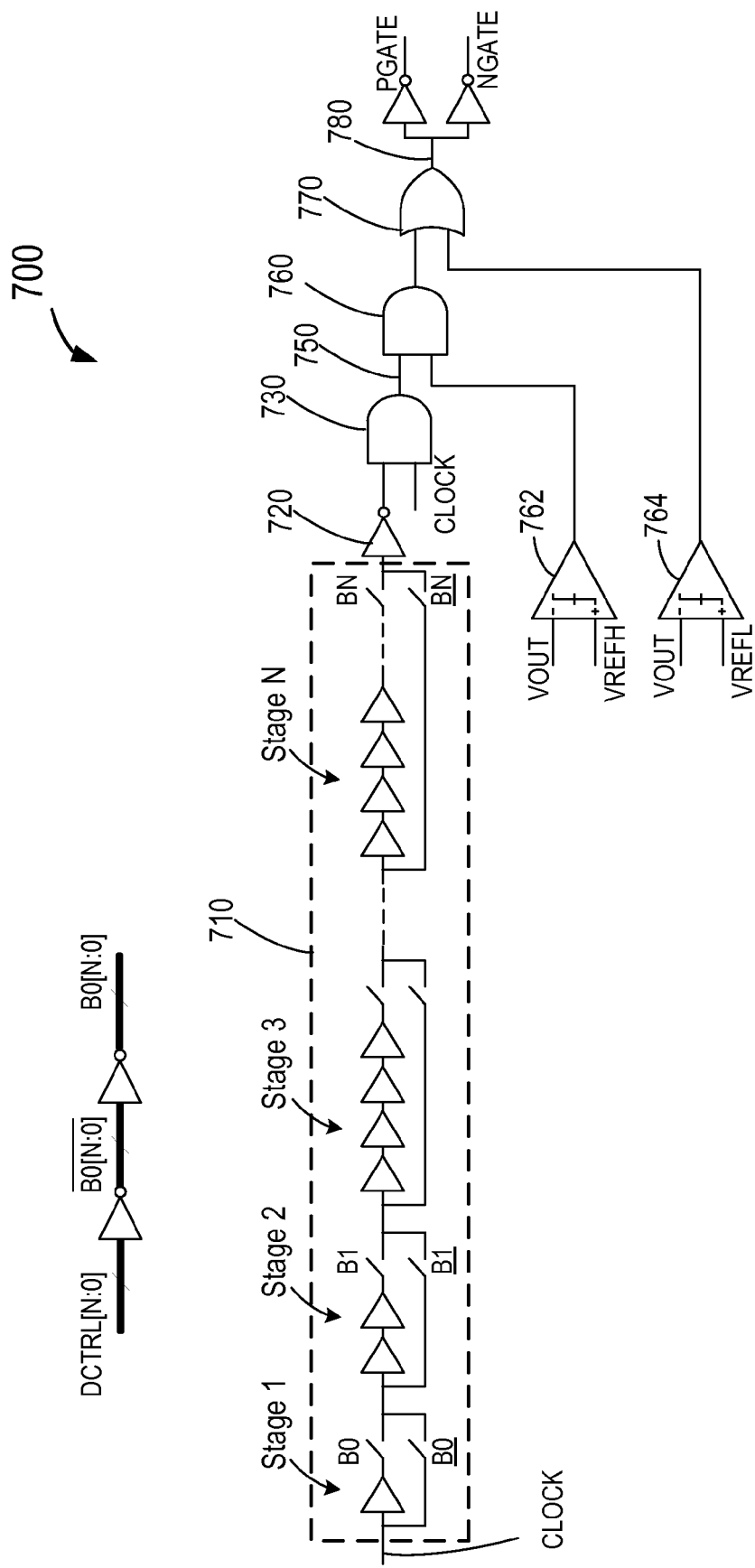
FIG. 7 is a simplified circuit diagram illustrating a PWM signal generation circuit according to another embodiment of the present invention.

FIG. 7 is a simplified circuit diagram illustrating a PWM signal generation circuit according to another embodiment of the present invention. As shown in FIG. 7, PWM signal generation circuit 700 can be used to replace PWM generator 538 in voltage control circuit 536 in FIG. 5. PWM signal generation circuit 700 includes a digital logic circuit that is configured to generate a power switch control pulse 750 having a pulse width determined by a time delay through a programmable digital buffer chain 710 configured to provide a time delay determined by the control signal DCTRL[N:0], which is generated by the delay tracking circuit as described above. In this example, DCTL has N+1 bits representing a binary number. The programmable digital buffer chain includes a plurality of stages, e.g., Stage 1, Stage 2, Stage 3, . . . , and Stage N. Each stage can have one or more delay elements, and each stage can be bypassed in response to a respective bit in the control signal. In the embodiment of FIG. 7, Stage 1 has one delay element which can be an inverter or a buffer circuit. Stage 1 also has two switches controlled by bit 0 of DCTRL[N:0], and it is bypassed if bit 0 is a zero. Similarly, Stage 2 has two delay elements and two switches. Stage 1 has two switches control by bit 1 of DCTRL[N:0], and it is bypassed if bit 1 is a zero. Stage 3 has four delay elements and is controlled by bit 3 of DCTRL [N:0], and Stage N has $2^N$ delay elements and is controlled by bit N of DCTRL[N:0]. As shown in FIG. 7, power switch control pulse 750 at the output of a first AND gate 730 is configured to be a control pulse having pulse width determined by a time delay through a programmable digital buffer chain 710 configured to provide a time delay determined by the control signal DCTRL[N:0].

As shown in FIG. 7, programmable digital buffer chain 710 receives a clock signal CLOCK as an input, and the output of programmable digital buffer chain 710 is received by an inverter 720, which feeds into first AND gate 730. The output of the chain is ANDed with the input clock in order to provide the pulse. The signal 750 at the output of AND gate 730 is a pulse signal that has a width that represent the propagation delay of digital buffer which is set by the digital control signal. PWM signal generation circuit 700 also as additional circuit for ensuring proper range of the output signal. For example, the control pulse is gated by two comparator output signals, which ensure that the PWM signal maximizes when the output voltage is too low or ensures that the PWM signal stops when the output signal is too high. As shown in FIG. 7, a second AND gate 760 and OR gate 770 are configured to receive signals from a first comparator 762 and a second comparator 764, which compares the output signal to a high reference voltage VREFH and a low reference voltage VREFL, respectfully. If the regulated output Vreg is higher than VREFH, the PWM signal will be blocked. If the output signal is lower than VREFL, the PWM signal is allowed to pass through. The output 780 is a PWM control signal that can be fed into the PMOS and NMOS power transistors in voltage control circuit 537 in voltage regulation circuit 530 in FIG. 5. In embodiments of this invention, PWM signal generation circuit 700 includes only logic gates, which can be simpler and less expensive to implement than a conventional PMW control circuit without loss of accuracy. Possible loss of accuracy caused by the digital buffers in PWM signal generation circuit 700 can be compensated by the delay locked control circuit described herein. FIG. 7 also shows that control signals B0, B0, B1, B1, . . . , BN, which control the switches in programmable digital buffer chain 710, are generated from DCTRL[N:0].

While the above is a description of specific embodiments of the invention, the description should not be taken as limiting the scope of the invention. It is understood that the examples and embodiments described herein are for illustrative purposes only and that various modifications or changes can be made in light thereof.

What is claimed is:

1. A voltage regulator, comprising:
   a series delay chain including a plurality of delay elements providing a plurality of delayed logic signals as a thermometer code, the delay chain receiving an output voltage of the voltage regulator as its supply voltage;
   a first timing control clock coupled to the input of the series delay chain;
   a plurality of latches coupled to the corresponding plurality of delay elements for latching the thermometer code;
   a second timing control clock coupled to the plurality of latches to determine the latching time of the thermometer code;
   a thermometer to binary encoder coupled to the plurality of latches to provide a first binary number that is indicative of an estimated delay of the series delay chain;
   a signal processing circuit for providing a digital control signal indicative of a difference between the first binary number and a second binary number that represents a target delay; and
   a voltage control circuit coupled to the signal processing circuit for adjusting the output voltage based on the digital control signal from the processing circuit, such that the estimated delay of the delay chain matches the target delay,
   wherein the second binary number that represents the target delay is determined based on a timing difference between the first timing control clock and the second timing control clock.

2. The voltage regulator of claim 1, wherein the thermometer to binary encoder is configured to receive a thermometer code signal from multiple nodes in the delay chain and provide a digital signal comprising a plurality of bits representing the first binary number.

3. The voltage regulator of claim 1, wherein the signal processing circuit comprises:
   a digital difference circuit for providing an error signal indicative of a difference between the first binary number with the second binary number that represents a target delay;
   a digital gain circuit coupled to the digital difference circuit for amplifier the error signal; and
   a digital loop filter circuit coupled to the digital gain circuit for configured to provide loop stability of the voltage regulator and for providing the control signal.

4. The voltage regulator of claim 1, wherein each of the delay elements comprises an inverter or a buffer circuit.

5. The voltage regulator of claim 1, wherein the second timing control clock signal is derived from the first timing control clock signal by a delay circuit.

6. The voltage regulator of claim 5, wherein the delay circuit comprises an inverter, a gate delay, or a resistor-capacitor delay.

7. The voltage regulator of claim 1, wherein the voltage control circuit comprises a PWM (Pulse Mode Modulation) control circuit.

8. The voltage regulator of claim 1, wherein the voltage control circuit comprises an LDO (low-dropout) circuit.

9. The voltage regulator of claim 8, wherein the LDO circuit comprises:
   a DAC (digital-to-analog) converter;
   a comparator; and
   a first and a second transistor.

10. The voltage regulator of claim 1, wherein the voltage control circuit comprises a digital logic circuit that is configured to generate a control pulse having a pulse width determined by a time delay through a programmable digital buffer chain configured to provide a time delay determined by the digital control signal,
    wherein the programmable digital buffer chain includes a plurality of stages, each stage having one or more delay elements, and each stage is configured to be bypassed in response to a respective bit in the digital control signal.

11. A voltage regulator for controlling a power supply voltage to a circuitry, comprising a delay tracking circuit and a voltage regulation circuit coupled to the delay tracking circuit;
    wherein the delay tracking circuit comprises:
        a series delay chain including a plurality of delay elements providing a plurality of delayed logic signals as a thermometer code, the delay chain receiving an output voltage of the voltage regulator as its supply voltage; and
        a thermometer to binary encoder configured to convert the thermometer code to a first binary number that is indicative of an estimated delay of the series delay chain;
    wherein the voltage regulation circuit comprises:
        a signal processing circuit for providing a digital control signal representing a difference between the first binary number and a second binary number that represents a target delay; and
        a voltage control circuit coupled to the signal processing circuit for adjusting the output voltage to vary a delay of the series delay chain based on the digital control signal from the processing circuit, such that the delay of the delay chain matches the target delay.

12. The voltage regulator of claim 11, wherein the delay tracking circuit further comprises:
    a plurality of latches coupled to the corresponding plurality of delay elements for latching the thermometer code;
    a first timing control clock coupled to the input of the series delay chain;
    a second timing control clock coupled to the plurality of latches to determine the latching time of the thermometer code;
    wherein the thermometer to binary encoder is coupled to the plurality of latches to provide the first binary number that is indicative of an estimated delay of the delay chain;
    wherein the second binary number that represents the target delay is determined based on a timing difference between the first timing control clock and the second timing control clock.

13. The voltage regulator of claim 11, wherein the thermometer to binary encoder is configured to receive the thermometer code signal from multiple nodes in the delay chain and provide a digital signal comprising a plurality of bits representing the first binary number.

14. The voltage regulator of claim 11, wherein the output voltage is coupled to each of the plurality of delay elements.

15. The voltage regulator of claim 11, wherein each of the delay elements comprises an inverter.

16. The voltage regulator of claim 11, wherein each of the delay elements comprises a buffer circuit.

17. The voltage regulator of claim 11, wherein the signal processing circuit comprises:
- a digital difference circuit for providing an error signal indicative of a difference between the first binary number with the second binary number that represents the target delay;
- a digital gain circuit coupled to the digital difference circuit for amplifier the error signal; and
- a digital loop filter circuit coupled to the digital gain circuit for configured to provide loop stability of the voltage regulator and for providing the control signal.

18. The voltage regulator of claim 11, wherein the voltage control circuit comprises a PWM (Pulse Mode Modulation) control circuit.

19. The voltage regulator of claim 11, the voltage control circuit comprises an LDO circuit.

20. The voltage regulator of claim 11, wherein the voltage control circuit comprises a digital logic circuit that is configured to generate a control pulse having a pulse width determined by a time delay through a programmable digital buffer chain configured to provide a time delay determined by the digital control signal,
- wherein the programmable digital buffer chain includes a plurality of stages, each stage having one or more delay elements, and each stage is configured to be bypassed in response to a respective bit in the digital control signal.

* * * * *